United States Patent [19]
Bulsara et al.

[11] Patent Number: 6,008,642
[45] Date of Patent: Dec. 28, 1999

[54] STOCHASTIC RESONANCE DETECTOR FOR WEAK SIGNALS

[75] Inventors: Adi R. Bulsara; Mario E. Inchiosa, both of San Diego, Calif.; Luca Gammaitoni, Perugia, Italy; Frank E. Gordon, San Diego, Calif.

[73] Assignee: The United States of America as represented by the Secretary of the Navy, Washington, D.C.

[21] Appl. No.: 08/917,655

[22] Filed: Aug. 25, 1997

[51] Int. Cl.[6] .................................................. G01R 27/28
[52] U.S. Cl. .......................... 324/248; 324/633; 324/619; 324/652
[58] Field of Search ................................... 324/248, 633, 324/652, 618, 619

[56] References Cited

PUBLICATIONS

"Stochastic Resonance in a Superconducting Loop With a Josephson Junction", J. Appl. Phys. 77 (6), Mar. 15, 1995, A. D. Hibbs and A. L. Singsaas.

"Flux Amplification Using Stochastic Superconducting Quantum Interference", Appl. Phys. Lett. 66 (1), Jan. 2, 1995, R. Rouse, Siyuan Han, and J.E. Lukens.

"Noise–Controlled Resonance Behavior in Nonlinear Dynamical Systems with Broken Symmetry", A. R. Bulsara and M.E. Inchiosa, Jan. 1996 American Physical Society.

Primary Examiner—Josie Ballato
Assistant Examiner—Jose M. Solis
Attorney, Agent, or Firm—Harvey Fendelman; Michael A. Kagan; Eric James Whitesell

[57] ABSTRACT

A stochastic resonator signal detector comprises a multi-stable nonlinear device for coupling to an input signal and a control signal coupled to the multi-stable nonlinear device for varying asymmetry among stable states of the multi-stable nonlinear device. The interaction of the input signal with the control signal in the multi-stable nonlinear device generates an output signal having an amplitude responsive to the input signal amplitude and a frequency range that comprises harmonics of products of the control signal and the input signal.

11 Claims, 6 Drawing Sheets

STOCHASTIC RESONANCE DETECTOR FOR WEAK SIGNALS

LICENSING INFORMATION

The invention described below is assigned to the United States Government and is available for licensing commercially. Technical and licensing inquiries may be directed to Harvey Fendelnan, Legal Counsel For Patents, NCCOSC RDTE DIV CODE 0012, 53510 Silvergate Avenue Room 103, San Diego, Calif. 92152-5765; telephone no. (619)553-3818; fax no. (619)553-3821.

BACKGROUND OF THE INVENTION

The present invention relates to the detection of weak signals masked by interfering noise. More specifically, but without limitation thereto, the present invention relates to a detector implementing stochastic resonance in multistable detectors to detect and quantify a weak signal in the presence of in-band noise.

Electronic detectors of very weak signals are frequently subject to in-band noise limitations. To detect and quantify signals, for example magnetic flux signals using magnetometers implemented by SQUIDs (superconducting quantum interference devices), elaborate readout/bias schemes coupled with noise-cancellation techniques are typically employed. In practice, however, the effectiveness of these techniques is limited by sensor design constraints.

The detection of periodic signals can, under certain conditions, be aided by the presence of controlled amounts of background noise in the sensor, as long as the sensor is nonlinear; the mechanism for this is known as stochastic resonance. However, one frequently encounters signals having frequencies that make detection difficult. An example of interest is that of signals having extremely high frequencies that cannot be easily detected by conventional electronics, and that might actually fall outside the bandwidth of system noise so that amplification via stochastic resonance or any other noise-mediated technique is impractical.

Superconducting quantum interference devices (SQUIDS) are extremely sensitive detectors of magnetic flux and have been the subject of extensive research and development for over 20 years. Apart from improvements in the basic electronic components used to bias and read the SQUID, few significant improvements have been made in this maturing technology due to the sensitivity of the SQUID to environmental noise. Flux jumps, slew rate and dynamic range are common problems encountered when using SQUIDs in practical applications. A continued need exists for a way to improve SQUID-based detectors beyond their current limitations.

SUMMARY OF THE INVENTION

A stochastic resonance detector for weak DC or low-frequency AC signals of the present invention is directed to overcoming the problems described above, and may provide further related advantages. No embodiment of the present invention described herein shall preclude other embodiments or advantages that may exist or become obvious to those skilled in the art.

A stochastic resonator signal detector of the present invention comprises a multi-stable nonlinear device for coupling to an input signal and a control signal coupled to the multi-stable nonlinear device for varying asymmetry among stable states of the multi-stable nonlinear device. The interaction of the input signal with the control signal in the multi-stable nonlinear device generates an output signal having an amplitude responsive to the input signal amplitude and a frequency range that comprises harmonics of products of the control signal and the input signal.

An advantage of the stochastic resonance detector for weak DC signals of the present invention is that extremely weak DC signals may be detected and quantified in the presence of interfering noise.

Another advantage is that remote magnetic sensors may be made with increased sensitivity for a variety of military and commercial applications.

Still another advantage is that detection of weak DC signals may be performed outside the low frequency band where most nonlinear dynamic sensors suffer from significant noise constraints.

Yet another advantage is that SQUIDs having high sensitivity may be constructed from existing high-temperature superconducting materials.

Another advantage is that a single nonlinear sensor may be replaced by an array of nonlinear sensors to realize even more substantial signal processing improvements.

The features and advantages summarized above in addition to other aspects of the present invention will become more apparent from the description, presented in conjunction with the following drawings.

DESCRIPTION OF THE INVENTION

The following description is presented solely for the purpose of disclosing how the present invention may be made and used. The scope of the invention is defined by the claims.

The sensitivity of SQUIDs to environmental noise may be significantly reduced by using biased stochastic resonance to translate the signal spectra away from the high level noise spectra. Stochastic resonance may be described as a statistical process in which a noisy nonlinear, multi-stable system is modulated by a weak signal that induces transitions among the stable states of the system. In a system that exhibits stochastic resonance, the inherent noise of the system causes the transitions among states, but the transition probability is coherent with the weak signal.

Figures 1, 2, 3:
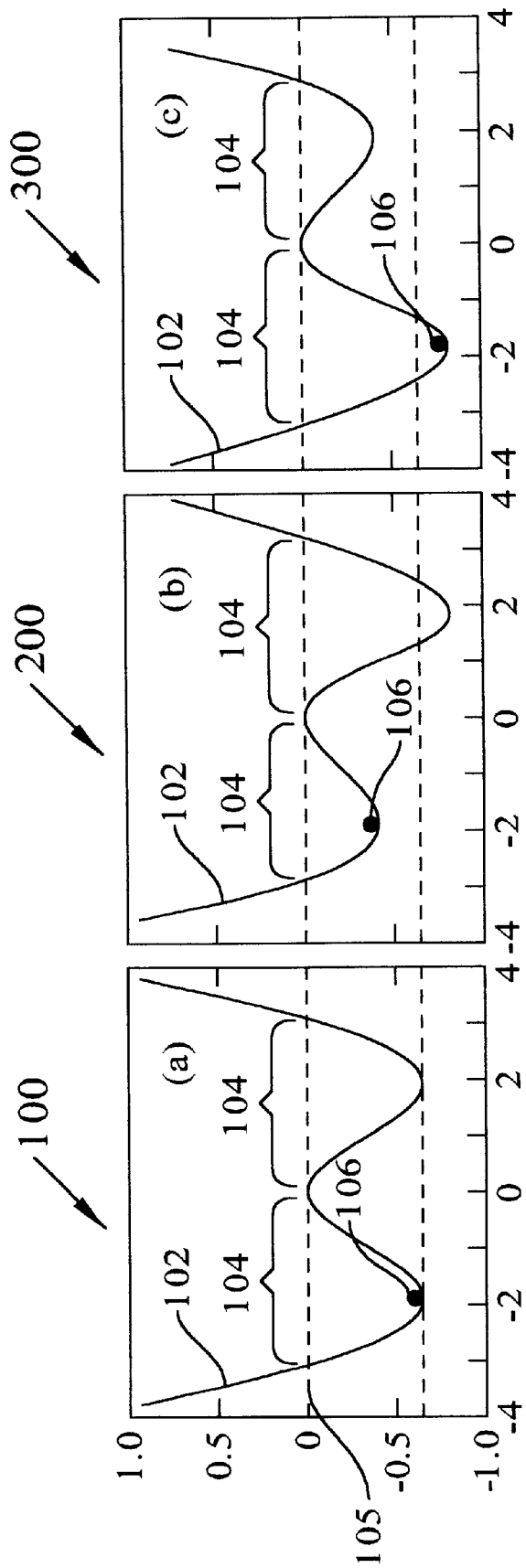
FIG. 1 is a plot of an unmodulated bistable potential function.
FIGS. 2 and 3 are plots of a modulated bistable potential function.

The operating principle of stochastic resonance may be understood in the context of a bistable potential function modulated by a periodic signal. FIG. 1 illustrates a plot 100 of an exemplary unmodulated potential function 102. Note the effect of adding a modulating signal to potential function 102 shown in plot 200 of FIG. 2 and plot 300 of FIG. 3 on the level of potential wells 104 with respect to barrier height 105 which particle 106 must overcome to switch into an opposite potential well 104. An overdamped particle 106 confined in such a double-well potential cannot transit between the two wells in the absence of noise, but with the addition of noise, the particle may move between the two wells in a well-defined statistical manner. When a weak modulation signal is applied to the system, stochastic resonance arises from the interaction between the modulating signal and the statistical transition rate driven by the noise. More precisely, in the presence of the weak modulating signal, the transitions between the two states will be coherent to some extent with the modulating signal. It is this periodic modulation of the transition rate which gives the coherence between the modulating signal and the system response.

Two limiting examples of stochastic resonance are those in which the modulating signal is applied to the system in the presence of either zero noise or very high noise. If the modulating signal is so small that it does not induce a transition by itself, no transitions due to the modulating signal will occur at all in the presence of zero noise, and the coherence between the system response and the modulation signal will be zero. In the presence of very high noise the transitions are completely randomized, and the coherence is again zero. At some intermediate noise level the coherence between the modulating signal and the system response reaches a maximum, or "resonance". While this "resonance" condition is clearly not the same as resonance in a deterministic system, such as an LC parallel tuned circuit, the statistical meaning of the term is nevertheless well defined. In this particular example, the probability of finding a particle in one of potential wells 104 alternates between a minimum and a maximum value in concert with the modulation signal, representing an energy exchange in a real sense. Since the amplitude of this energy exchange mechanism passes through a maximum value for a specific noise intensity, the process may properly be viewed as a resonance phenomenon.

This resonance behavior in the presence of noise means that under some conditions the coherence between the SQUID system response and the weak modulating signal may actually be increased by increasing the noise of the system. In other words, the signal-to-noise ratio of this type of bistable system may actually be improved by increasing the noise level.

A generic bistable dynamic system may be described mathematically by the "particle in a potential" paradigm:

$$\tau_L dx/dt = -\frac{\partial U(x)}{\partial x} + A\sin(\omega t) + N(t) \quad (1)$$

where $U(x)$ is a bistable potential function, $\tau_L$ is a time constant, $N(t)$ is Gaussian noise, and $A\sin(\omega t)$ is a modulation signal of known amplitude and frequency. The time constant $\tau_L$ equals the SQUID loop inductance divided by the Josephson junction's normal state resistance, and has a typical value of about $10^{-10}$ to $10^{-12}$ seconds. Input frequencies should be kept well below the reciprocal of $\tau_L$. Limiting input frequencies to about 10 percent of this value results in a useful upper frequency limit of about 1 to 100 GHz. Due to the symmetry of $U(x)$ about the x-axis, i.e. $U(x)=U(-x)$, the power spectral density (PSD) of $x(t)$ exhibits spectral lines at odd multiples of the signal frequency $\omega$. The addition of a weak target signal, for example, a small DC signal, to the Gaussian noise skews the potential $U(x)$, causing spectral lines to appear at multiples $k\omega$ ($k$ is a positive integer) of the modulation signal frequency. The heights of all the harmonics are very sensitive functions of the symmetry-breaking DC signal as well as of the statistics of the noise $N(t)$. The amplitude peaks of the spectral lines at frequencies $k\omega$ occur at critical values of the noise variance $\sigma^2$.

It may be desirable to detect an AC target signal by shifting the detection function to another part of the frequency spectrum. A frequency shift may be achieved by adding the target signal $B \sin(\Omega t)$ to the control signal $A \sin(\omega t)$ in equation (1). The output signal will then include the frequency components $$|k_1\omega \pm k_2\Omega| \quad (2)$$

if the potential function $U(x)$ is symmetric, where $k_1$ and $k_2$ are integers and $k_1+k_2$ is odd. If, however, the potential function is asymmetric (the asymmetry may arise from the dynamics, or it may be deliberately introduced by adding a small DC signal term in equation (1)), then frequency components (2) may be recovered in the output, where $k_1$ and $k_2$ are any integers. The amplitude of a given tone combination depends on the signal amplitudes A and B as well as the potential function parameters. The problem of detecting a signal of frequency $\omega$ may thus be translated into the problem of detecting one of the tones given by (2) in a more convenient region of the output power spectrum by a careful selection of the known bias frequency $\Omega$. In addition, the presence of system noise $N(t)$ allows enhancement of the selected tone by stochastic resonance by adjusting either the noise intensity or the potential function parameters. This approach may be used for the detection of VHF signals, e.g. cyclic magnetic signals generated by nuclear quadrupole resonance detection of explosives, heavy metals, and drugs.

The spectral line amplitudes may be used to quantify the weak signal by using a matched filter or other spectral analyzer to measure the output signal $x(t)$ at even multiples of the modulation signal frequency $\omega$.

Alternatively, the weak signal may be quantified by using a decision function to detect changes in the amplitudes of the spectral lines at the odd harmonics of the modulation signal frequency $\omega$ when the target signal is switched on. By proper selection of the known modulation frequency $\omega$, the spectral lines used for detection of the weak signal may be translated to a portion of the power spectrum of $x(t)$ having a minimum noise level.

The spectral amplitude of a harmonic at a frequency $k\omega$ reaches a peak level when the following temporal matching conditions hold:

$$\langle t_l \rangle = \frac{n}{k}\frac{T}{2}, \; \langle t_r \rangle = T - \langle t_l \rangle, \; \frac{\langle t_l \rangle}{\langle t_r \rangle} = \frac{n/2k}{1 - n/2k} \quad (3)$$

wherein $T=2\pi/\omega$ is the period of the modulation signal, and $<t_l>$, $<t_r>$ are the left and right mean residence times respectively of the two bistable detector states, and n is a positive odd integer less than or equal to k.

The detection and quantification of weak signals described above may be used with, for example, an RF SQUID loop or virtually any bistable sensor to improve the signal-to-noise ratio of the sensor. In the case of an RF SQUID loop, the variable x is the normalized magnetic flux through the loop, and the potential function $U(x)$ incorporating the target DC signal x may be expressed as:

$$U(x) = \frac{1}{2}(x - x_0 - m/2)^2 - \frac{\beta}{4\pi^2}\cos(2\pi x) \quad (4)$$

which is bistable when $\beta$ exceeds a theoretically determined critical value for odd integer values of m. Theoretical calculations have verified the behavior predicted in equations (1)–(3) for k=1, 2, and numerical simulations have demonstrated this behavior for k=1–4. The conditions in (3) hold at the resonance peaks of the spectral amplitudes.

An example of a stochastic resonator signal detector of the present invention may be implemented as a SQUID magnetometer. A superconducting ring with two Josephson junctions is commonly known as a DC SQUID. In a DC SQUID the barrier height between flux states may readily be modulated by applying an electrical current to the Josephson junctions. In an RF SQUID modulating the barrier height between flux states is impractical because the superconducting ring electrically short-circuits the junction. A stochastic resonance detector of the present invention may be made by using an RF or a DC SQUID for the stochastic resonance function and connecting it to a second SQUID by a superconducting transformer to measure the flux state of the first SQUID. The two SQUIDs may be packaged together with a superconducting coupling circuit to avoid temperature differentials and noise pickup in the coupling circuit. Hereafter the first SQUID will be referred to as the SR (stochastic resonance) SQUID and the second SQUID will be referred to as the measuring SQUID. The SR SQUID is the novel element that acts as an input buffer to enhance the performance of the measuring SQUID.

Figure 4:
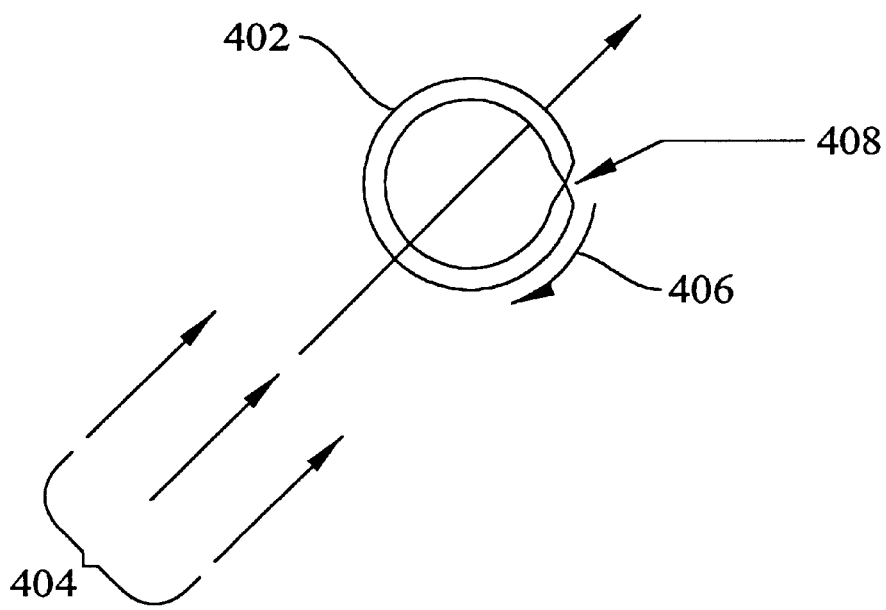
FIG. 4 is a diagram of an RF SQUID comprising a superconducting ring with a Josephson junction.
Figure 5:
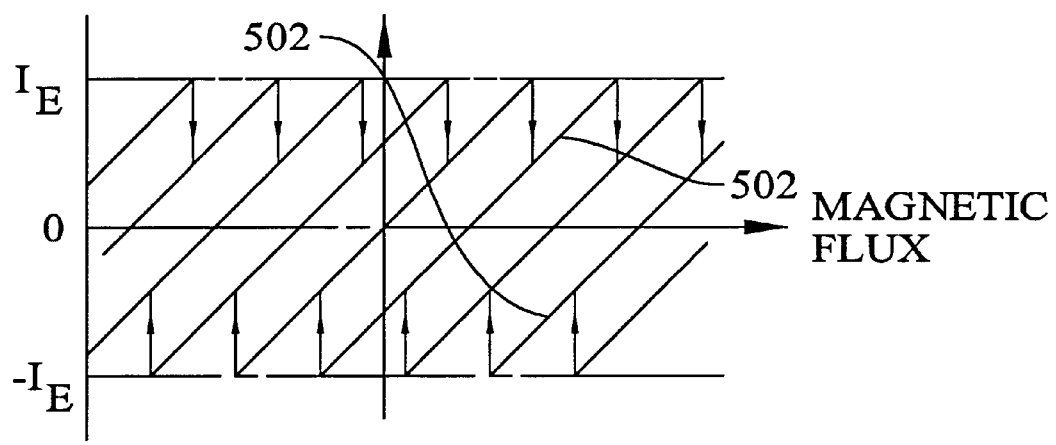
FIG. 5 is a plot of current vs. magnetic flux in the superconducting ring of FIG. 4.

Referring now to FIG. 4, an RF SQUID comprising a superconducting ring 402 is subjected to an applied magnetic flux 404. Magnetic flux 404 causes a supercurrent 406 to flow around superconducting ring 402 to maintain constant quantized flux through superconducting ring 402. As magnetic flux 404 is increased, superconducting current 406 will eventually exceed the critical current of Josephson junction 408. When this occurs junction 408 undergoes a momentary transition to the normal state, a flux quantum moves into or out of superconducting ring 402, supercurrent 406 drops by an amount corresponding to one flux quantum, and junction 408 returns to the superconducting state. Further increasing magnetic flux 404 causes the process to repeat as additional flux quanta move into or out of superconducting ring 402. The resulting relationship between magnetic flux 404 and superconducting current 406 is shown in the plot of FIG. 5. Superconducting current 406 increases or decreases linearly with magnetic flux 404 except at the flux transitions that occur when superconducting current 406 exceeds critical current $I_E$ or $-I_E$ of junction 408.

Figure 6:
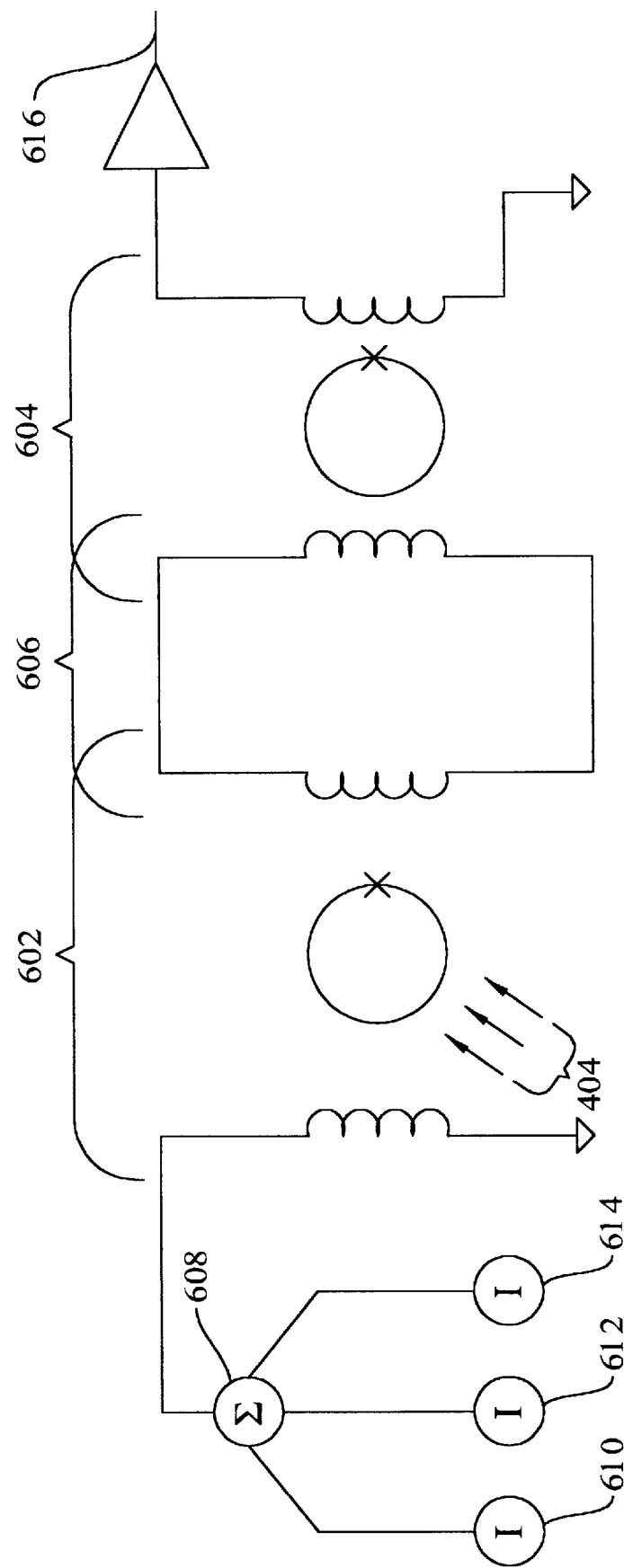
FIG. 6 is an electrical schematic of a stochastic resonance detector for weak DC signals of the present invention.

FIG. 6 is a schematic of a stochastic resonance detector 600 of the present invention. SR SQUID 602 is coupled to measuring SQUID 604 by superconducting transformer 606. SR SQUID 602 is coupled to a summing junction 608 that sums three inputs: DC bias 610, stochastic noise signal 612, and a modulating signal 614. DC bias 610 is used to adjust the operating point shown as "0" in FIG. 7 to the midpoint between the upper and lower transition points. Stochastic noise signal 612 and modulating signal 614 are adjusted to maximize the detection of a target signal, in this case magnetic flux 404, as described above. Alternatively, the target signal may be an additional input to summing amplifier 608 (not shown). Transitions in magnetic flux 404 in SR SQUID 602 generate shifts in the current flowing between SR SQUID 602 and measuring SQUID 604 that cause a corresponding shift in the output of measuring SQUID 604.

Figure 7:
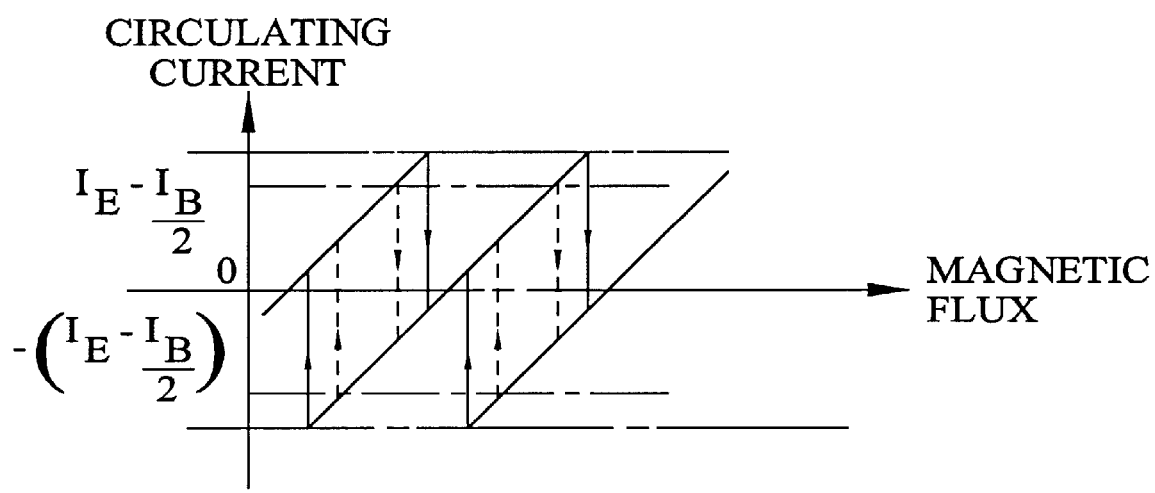
FIG. 7 is a plot of current vs. magnetic flux in a DC-biased SQUID.
Figure 9:
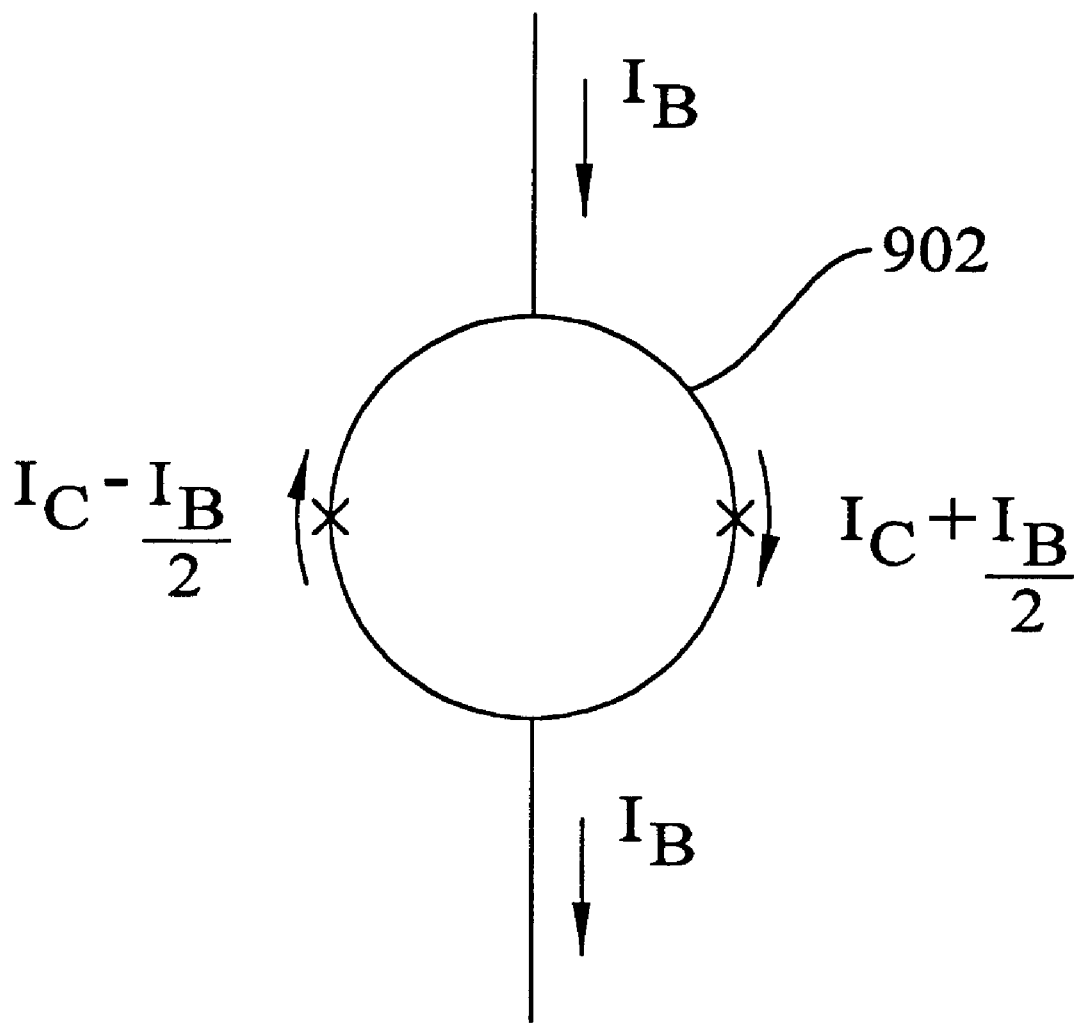
FIG. 9 is a diagram of a DC SQUID.

Filtering may be provided according to well known techniques in either the coupling transformer or an output buffer amplifier 616 to remove frequency components of stochastic noise 612 input to SR SQUID 602 that are above or below the frequency of modulating signal 614. An important advantage of using a loop containing two Josephson junctions as shown in the diagram of a DC SQUID in FIG. 9 is that the barrier height in the double well potential shown in FIG. 1 may be adjusted by introducing a bias current $I_B$ directly into superconducting ring 902. The plot of superconducting current vs. magnetic flux with DC bias added shown in FIG. 7 illustrates the transition shift from the normal position shown by the solid lines to the biased position shown by the dashed lines. Since the transitions have moved closer together, the effective barrier height 105 shown in FIG. 1 for these transitions has been reduced. The ability to vary barrier height 105 allows matching the stochastic resonance parameters to the target signal for optimizing detection performance.

Figure 8:
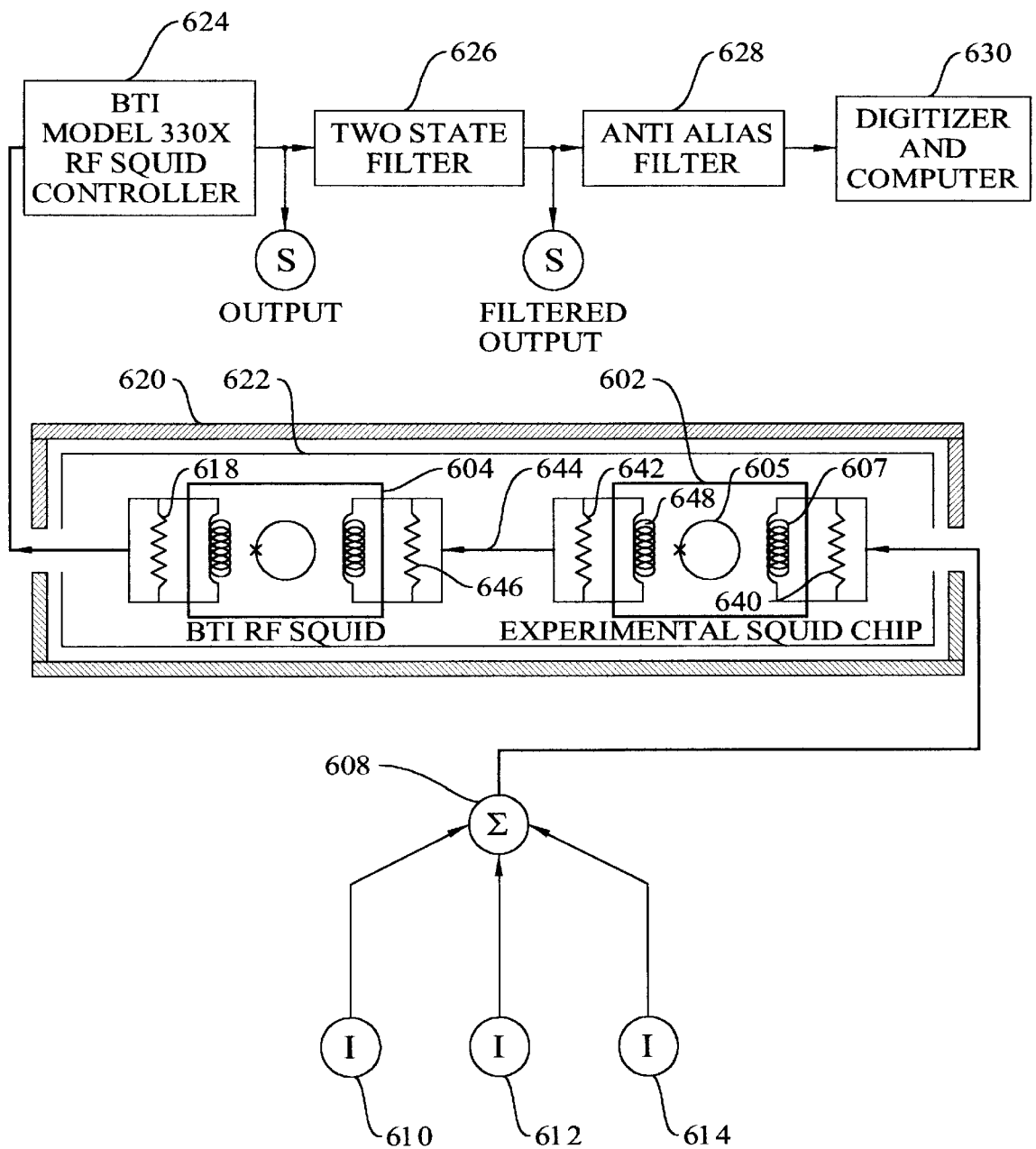
FIG. 8 is a hardware configuration diagram of the stochastic resonance detector shown in the schematic FIG. 6.

An apparatus implementing the schematic of FIG. 6 is shown in FIG. 8. SR SQUID 602 preferably has a superconducting ring 605 with two Josephson junctions, a superconducting input coil 607 coupled to superconducting ring 605 for coupling magnetic flux directly into the loop, and a superconducting output coil 648 coupled to superconducting ring 605 to provide an output current proportional to the magnetic shielding flux in superconducting ring 605. Shunt resistors 640 and 642 may be added to filter out high frequency noise that would otherwise AC-bias superconducting ring 605. In this example, measuring SQUID 604 was incorporated in a standard Biomagnetic Technologies Inc. model 330x RF SQUID system 624. Measuring SQUID 604 is coupled to SR SQUID 602 by niobium wires 644. Shunt resistors 646 and 618 may be added to further reduce coupling external AC noise into measuring SQUID 604. SR SQUID 602 and measuring SQUID 604 may be contained in a Dewar flask 620 filled with liquid helium to maintain an appropriate cryogenic operating temperature and enclosed within a superconducting niobium shield 622 to exclude stray magnetic fields.

The output current from measuring SQUID 604 in this example was measured by a Biomagnetic Technologies Inc. model 330x RF SQUID controller 624. A two-state filter 626 may be coupled to controller 624. An antialias filter 628 may be coupled to two-state filter 626 to avoid aliasing effects in Fourier signal analysis prior to digitization of the measured signal by digitizer 630. The measured signal may be input to a spectrum analyzer from either the non-filtered or the filtered "S" output or input to a computer (not shown) from digitizer 630.

Other modifications, variations, and applications of the present invention may be made in accordance with the above teachings other than as specifically described to practice the invention within the scope of the following claims.

We claim:

1. A stochastic resonator signal detector comprising:
a multi-stable nonlinear device for coupling to an input signal;
and a control signal coupled to said multi-stable nonlinear device for varying asymmetry among stable states of said multi-stable nonlinear device to generate an output signal having an amplitude responsive to said input signal amplitude and a frequency range comprising harmonics of products of said control signal and said input signal.

2. The stochastic resonator signal detector of claim 1 wherein said control signal comprises:

a stochastic noise signal for adjusting the switching rate among said stable states to maximize amplitudes of said harmonics, and a modulating signal for adjusting a frequency of said output signal.

3. The stochastic resonator signal detector of claim 2 further comprising a source of said stochastic noise signal.

4. The stochastic resonator signal detector of claim 2 further comprising a source of said modulating signal.

5. The stochastic resonator signal detector of claim 2 further comprising a readout device to quantify said amplitudes of said harmonic signals.

6. The stochastic resonator signal detector of claim 1 wherein said multi-stable nonlinear device comprises a DC SQUID.

7. The stochastic resonator signal detector of claim 5 wherein said readout device comprises an RF SQUID.

8. The stochastic resonator signal detector of claim 7 wherein said readout device further comprises a spectrum analyzer coupled to said RF SQUID for displaying said output signal.

9. The stochastic resonator signal detector of claim 7 wherein said readout device further comprises a digitizer coupled to said RF SQUID for inputting said output signal to a computer.

10. The stochastic resonator signal detector of claim 1 wherein said multi-stable nonlinear device may be described substantially by $$\tau_L dx/dt = -\frac{\partial U(x)}{\partial x} + A\sin(\omega t) + B\sin(\Omega t) + N(t)$$

where $U(x)$ is a bistable potential function, $\tau_L$ is a time constant, $N(t)$ is Gaussian noise, and $A\sin(\omega t)$ is a control signal of known amplitude A and known frequency $\omega$, and $B\sin(\Omega t)$ is an input signal having an amplitude B and a frequency $\Omega$.

11. The stochastic resonator signal detector of claim 10 wherein said potential function is given substantially by $$U(x) = \frac{1}{2}(x - x_0 - m/2)^2 - \frac{\beta}{4\pi^2}\cos(2\pi x)$$

wherein $x_0$ is a target signal, m is an odd integer, and x is normalized magnetic flux through an RF SQUID loop.

* * * * *